(12) United States Patent
Shiiki

(10) Patent No.: US 6,777,754 B2
(45) Date of Patent: Aug. 17, 2004

(54) SEMICONDUCTOR DEVICE AND METHOD OF MANUFACTURING THE SAME

(75) Inventor: Mika Shiiki, Chiba (JP)

(73) Assignee: Seiko Instruments Inc., Chiba (JP)

(*) Notice: Subject to any disclaimer, the term of this patent is extended or adjusted under 35 U.S.C. 154(b) by 0 days.

(21) Appl. No.: 10/339,072

(22) Filed: Jan. 9, 2003

(65) Prior Publication Data
US 2003/0160285 A1 Aug. 28, 2003

(30) Foreign Application Priority Data
Jan. 10, 2002 (JP) .......... 2002-003490
Jul. 3, 2002 (JP) .......... 2002-195064

(51) Int. Cl.[7] .......... H01L 29/72
(52) U.S. Cl. .......... 257/358; 257/60; 438/230

(58) Field of Search .......... 257/60, 62, 358, 257/361; 438/230, 231

(56) References Cited

U.S. PATENT DOCUMENTS 6,369,409 B1 * 4/2002 Takasu et al. .......... 257/60

* cited by examiner

Primary Examiner—Edward Wojciechowicz
(74) Attorney, Agent, or Firm—Adams & Wilks

(57) ABSTRACT

A semiconductor device a bleeder resistance circuit having conductors, an insulating film disposed on the conductors, and thin film resistors each overlying a respective one of the conductors with the insulating film disposed therebetween. Each of the thin film resistors contains p-type impurities and has a thickness in the range of 10 to 2000 angstroms. Each of the conductors is electrically connected to and has the same electric potential as a respective one of the thin film resistors.

31 Claims, 13 Drawing Sheets (a)

(b)

(c)

(d)

(e)

(f)

SEMICONDUCTOR DEVICE AND METHOD OF MANUFACTURING THE SAME

BACKGROUND OF THE INVENTION

1. Field of the Invention

The present invention relates to a semiconductor device and, in particular, to a bleeder resistance circuit using thin film resistors, to a semiconductor device having the bleeder resistance circuit, and to a method of manufacturing the semiconductor device.

2. Description of the Related Art

Large numbers of conventional bleeder resistance circuits using thin film resistors like those shown in FIG. 16 are in use. The term bleeder resistance circuit denotes a circuit for obtaining a predetermined voltage from a power supply voltage. In the bleeder resistance circuit, a plurality of resistance elements arranged in series are connected, and divided voltage is performed to thereby obtain a predetermined voltage. Alternatively, predetermined ratios of the power supply voltage are output.

A MOS transistor 134 is formed on a silicon semiconductor substrate 101. The MOS transistor 134 is formed on the silicon semiconductor substrate 101 with a source region 131 and a drain region 132 separated from each other. A polysilicon gate electrode 133 is formed on the silicon semiconductor substrate 101, through a gate insulating film 100, between the source region 131 and the drain region 132. A field insulation film 135 for element separation is formed on the silicon semiconductor substrate 101 in the periphery of the MOS transistor 134. A polysilicon thin film resistor 139 which becomes a resistance element is formed on the field insulation film 135. The polysilicon thin film resistor 139 becomes a resistor of a portion of a bleeder resistance circuit. An intermediate insulating film 140 is formed on the polysilicon thin film resistor 139, and the source region 131, the drain region 132, and the polysilicon thin film resistor 139 are wired by aluminum wirings 136 formed in contact holes formed in the intermediate insulating film 140.

Several arrangements are known which are not concerned with the electric potential of the wirings on the thin film resistor 139 or the electric potential of the conductors under the thin film resistor 139. Further, polysilicon is often used as the thin film resistor material, and the polysilicon is known, which has the film thickness set to be the same as that of the gate electrode 133 of the MOS transistor 134, with the same polarity, and has temperature characteristics for cases in which the MOS transistor 134 is mounted within the same chip in combination therewith.

However, there is a problem with bleeder resistance circuits using conventional thin film resistors in that the divided voltage ratio is often inaccurate. The resistance value of the thin film resistors changes due to the surrounding electric potentials, in particular due to differences in the surrounding electric potentials. Further, change in the resistance value due to the temperature of the polysilicon thin film resistor (resistance value temperature coefficient) is large for conventional bleeder resistance circuits in which the MOS transistor 134 is mounted within the same chip in combination therewith, and there is a problem in that good divided voltage precision cannot be obtained over a wide range of temperatures.

SUMMARY OF THE INVENTION

In order to resolve the aforementioned problems, an object of the present invention is to provide a high precision bleeder resistance circuit having an accurate divided voltage ratio without temperature coefficient of a resistance value. In addition, an object of the present invention is to provide a semiconductor device having high precision and no temperature coefficient which uses the bleeder resistance circuit, for example, a voltage detector, a voltage regulator, and the like.

A first means employed in order to achieve the aforementioned objects relates to a semiconductor device of the present invention, in which a bleeder resistance circuit using thin film resistors has an electric potential of wirings on the thin film resistors and an electric potential of conductors under the thin film resistors nearly equal to the electric potential of each of the resistors. This is because the fact that the resistance value of the thin film resistors changes in accordance with the electric potential of wirings on, and the electric potential of conductors under, bleeder resistance circuits using thin film resistors (particularly polysilicon thin film resistors) has become clear.

A second means employed in order to achieve the aforementioned object relates to the semiconductor device of the present invention, in which a film thickness of polysilicon thin film resistors of a bleeder resistance circuit is made thinner than the film thickness of a gate electrode of a MOS transistor mounted within the same chip in combination therewith. This is because the fact that dispersion in the resistance values becomes smaller as the film thickness of the thin film resistors (particularly polysilicon thin film resistors) becomes thinner and the fact that the temperature dependence of the resistance value becomes smaller even with the same sheet resistance, are clear.

A third means employed in order to achieve the aforementioned objects relates to the semiconductor device of the present invention, in which a p-type impurity is used for the impurity introduced into the polysilicon thin film resistors of the bleeder resistance circuit This is because experiments performed by the inventors of the present invention make it clear that dispersion in the resistance values becomes smaller if the impurity introduced into the thin film resistors is p-type.

A fourth means employed in order to achieve the aforementioned objects relates to the semiconductor device of the present invention, in which the resistance value of the polysilicon thin film resistors of the bleeder resistance circuit is set to 700 Ω/square to 1 KΩ/square. This is because it is clear that the temperature dependence of the resistance value of the thin film resistors is from 0 to 100 ppm/° C. when the sheet resistance is from 700 Ω/square to 1 KΩ/square.

According to the semiconductor device of the present invention, by making the electric potential of wirings on thin film resistors and the electric potential of conductors below the thin film resistors nearly equal to the electric potential of each resistor in a bleeder resistance circuit using the thin film resistors, and by eliminating temperature characteristics, a high precision bleeder resistance circuit having an accurate divided voltage ratio can be achieved. For cases in particular in which polysilicon is used in the thin film resistors, the semiconductor device of the present invention can suppress dispersion in the resistance values, and can eliminate the temperature dependence of the resistance values, by making the film thickness of the polysilicon thin film resistors in the bleeder resistance circuit thin, and in addition, by introducing a p-type impurity into the polysilicon.

Semiconductor devices having high precision and a small temperature coefficient, for example, voltage detectors and voltage regulators, can be obtained by using this type of bleeder resistance circuit.

DETAILED DESCRIPTION OF THE PREFERRED EMBODIMENTS

Figure 1:
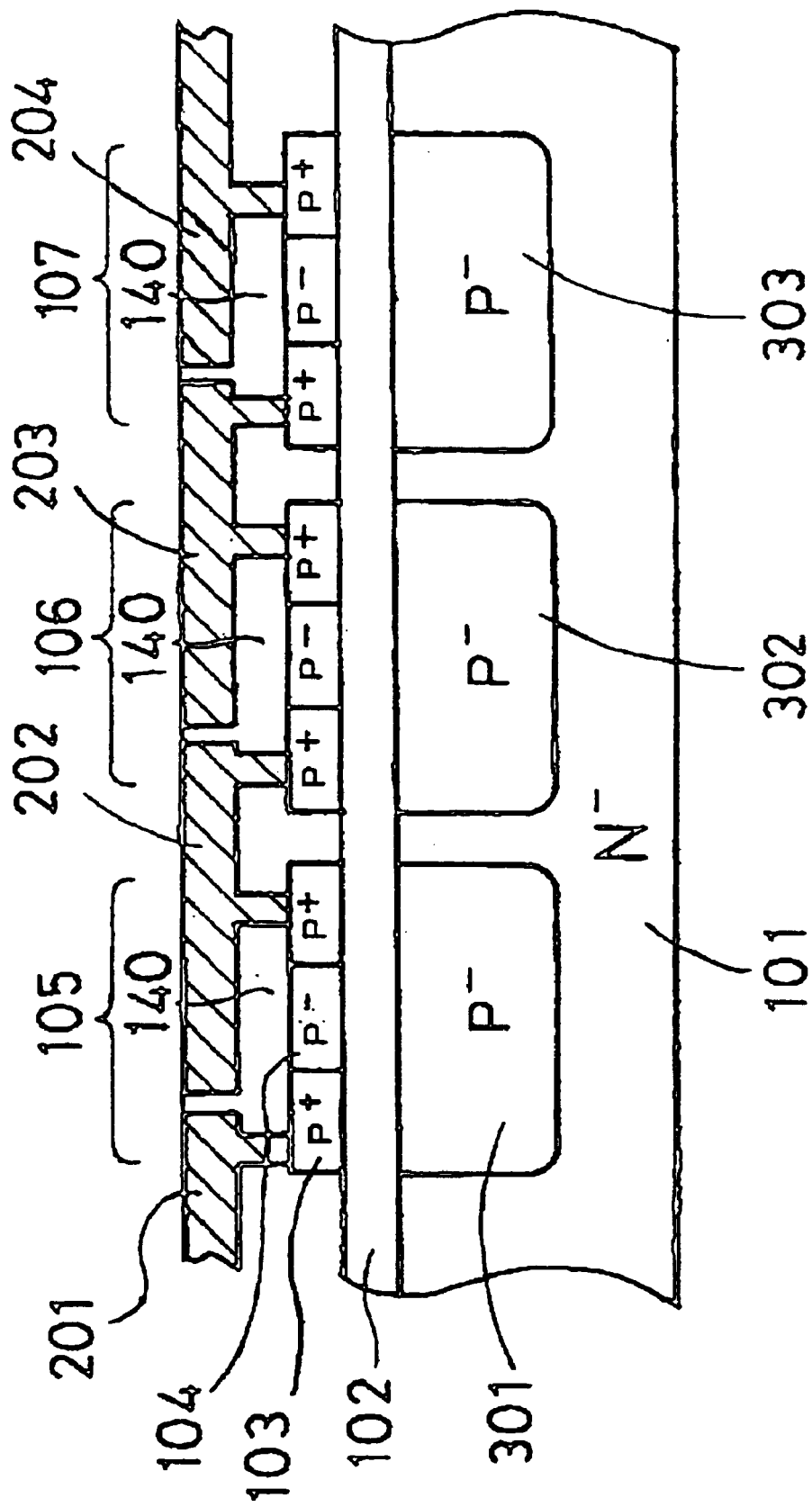
FIG. 1 is a schematic cross sectional diagram showing an embodiment of a bleeder resistance circuit region of a semiconductor device of the present invention.

Preferred embodiments of the present invention are explained below with reference to the figures. FIG. 1 is a schematic cross sectional diagram showing an embodiment of a bleeder resistance circuit region of a semiconductor device of the present invention.

P-type well regions 301, 302, and 303 are formed as partitioned within a silicon semiconductor substrate 101 having a low concentration of an n-type impurity. From the standpoint of preventing depletion of the silicon semiconductor substrate 101, it is preferable that the impurity concentration of the well regions 301, 302, and 303 be roughly equal to or greater than $1 \times 10^{16}$ atoms/cm$^3$ in the surface of the silicon semiconductor substrate 101. Although referred to as well regions, a high impurity concentration may be imparted.

A silicon oxide film 102 is formed on the silicon semiconductor substrate 101, and polysilicon resistors 105, 106, and 107 are formed on the silicon oxide film 102. Further, p-type impurity regions 103 are formed on the polysilicon resistors 105, 106, and 107 in order to contact external wirings. Wirings 201, 202, 203, and 204 made from aluminum are each connected to the p-type impurity regions 103. Further, the wirings 201, 202, 203, and 204 electrically connect the p-type impurity regions 103 of the neighboring polysilicon resistors 105, 106, and 107, respectively, as shown in FIG. 1. In addition, the wirings 201, 202, 203, and 204 are formed so as to each be disposed on one side of the polysilicon resistors 105, 106, and 107, through intermediate insulating films 140.

Although not shown in the figure here, the well region 301 is electrically connected to the wiring 202 and have the same electric potential, the well region 302 is electrically connected to the wiring 203 and have the same electric potential, and the well region 303 is electrically connected to the wiring 204 and have the same electric potential. That is, each of the polysilicon resistors 105, 106, and 107 is surrounded on their upper and lower surfaces by the wirings 202, 203, and 204, and the p-type impurity regions 103, through the insulating films. The electric potentials on the periphery of each of the polysilicon resistors 105, 106, and 107 are maintained at almost the electric potentials of the surrounding wirings and impurity regions.

The electric potential of a high resistance region 104 of the polysilicon resistor 105 and the electric potential of the wiring 202 on the upper portion of the polysilicon resistor 105 are therefore in a state of being nearly equal to the electric potential of the well region 301 in a portion under the polysilicon resistor 105. Similar relationships exist between the polysilicon resistors 106 and 107, the wirings 203 and 204 disposed on the upper portions of the polysilicon resistors 106 and 107, and the well regions 302 and 303 disposed in portions under the polysilicon resistors 106 and 107. The resistance values of each of the polysilicon resistors 105, 106, and 107 are thus correctly maintained by making the electric potentials of the polysilicon resistors themselves and the electric potentials of the wirings and well regions arranged on and under the polysilicon resistors equal. Note that, insulation between the silicon semiconductor substrate 101 and the polysilicon resistors 105, 106, and 107 can be kept high by using a composite film having a silicon nitride film as a substitute if there is a desire to form the silicon oxide film 102 so as to be thinner.

Further, a conductivity type of the silicon semiconductor substrate 101 may be p-type, and if so, the well regions 301, 302, and 303 are then given n-type conductivity type. Further, there are no limitations placed on the number of the polysilicon resistors 105, 106, and 107, and it may be set in accordance with the number of divided voltages required in the bleeder resistance circuit. In addition, although not shown in the figure, the well regions 301, 302, and 303 maybe arranged together on the basis of the several resistors or arranged collectively without any division if it difficult to separate and dispose the well regions in each resistor because high integration of the breeder resistance circuit is given the highest priority. A small amount of the divided voltage precision is sacrificed by doing so, but this is the next best thing to the embodiment shown in FIG. 1.

Further, although an explanation is made using FIG. 1, in which the silicon semiconductor substrate 101 is n-type, and the well regions 301, 302, and 303 are p-type, the silicon semiconductor substrate 101 may also be p-type and the well regions 301, 302, and 303 may also be n-type. In addition, the wirings are made from aluminum in FIG. 1, but the wirings may also use a laminate film of a barrier metal and a silicide film. The term barrier metal denotes a protective coating film having superior corrosion resistance and environmental resistance characteristics which is formed under the wirings in order to ensure that reliability of the semiconductor device is maintained and to provide it with long life. A laminate film of TiN and Ti is used as the barrier metal with the present invention, and Al—Si—Cu is used as the silicide film. Note that the silicide film may also be Al—Si.

Figure 2:
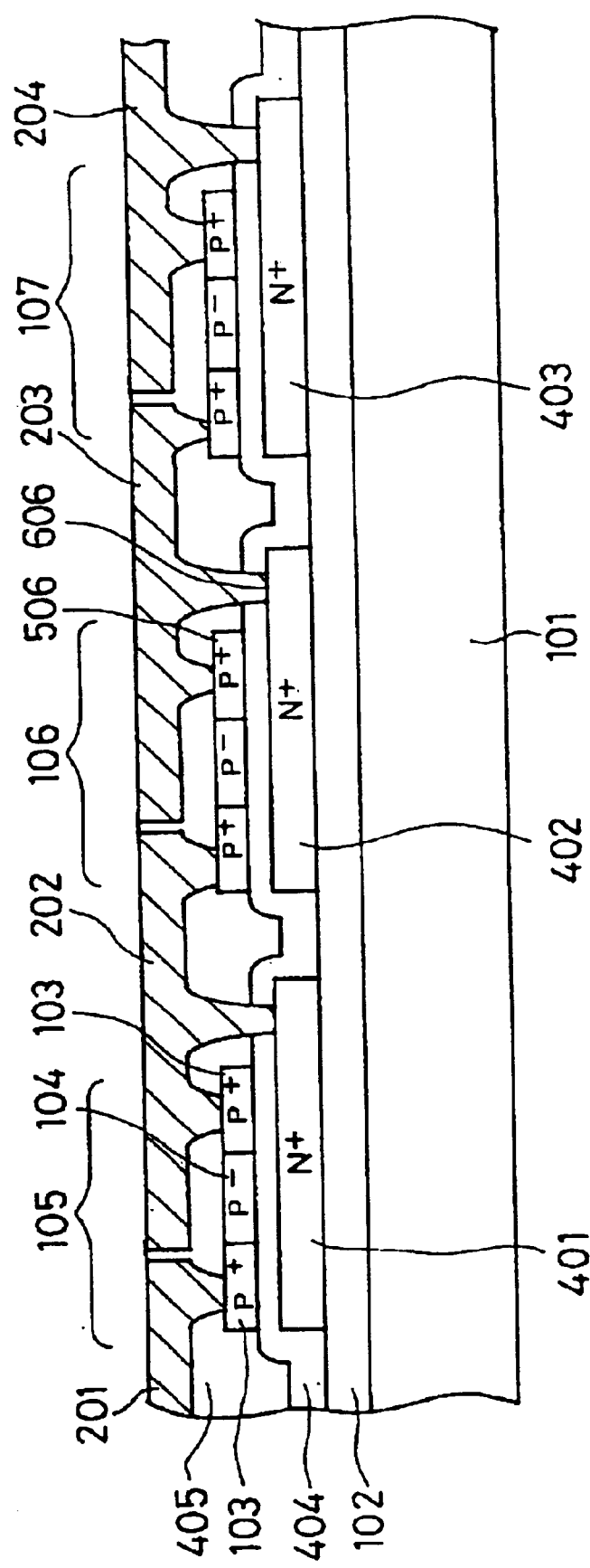
FIG. 2 is a schematic cross sectional diagram showing another embodiment of a bleeder resistance circuit region of a semiconductor device of the present invention.

FIG. 2 is a schematic cross sectional diagram showing another embodiment of a bleeder resistance circuit region of a semiconductor device of the present invention. The silicon oxide film 102 is formed on the silicon semiconductor substrate 101, and patterned high concentration n-type polysilicon thin films 401, 402, and 403 are formed on the silicon oxide film 102. The polysilicon resistors 105, 106, and 107 are formed on the high concentration n-type polysilicon thin films 401, 402, and 403 through a first insulating film 404 made from a silicon oxide film or the like.

Further, the aluminum wirings 201, 202, and 203 are formed on the polysilicon resistors 105, 106, and 107 through a second insulating film 405 made from a silicon oxide film or the like, and are connected to the high concentration p-type impurity regions 103 of the polysilicon resistors 105, 106, and 107, and to the high concentration n-type polysilicon thin films 401, 402, and 403 through contact holes 506 and 606, respectively. Thus, there is obtained a state in which the electric potential of the high resistance region 104 of the polysilicon resistor 105, the electric potential of the wiring 202 in the upper portion thereof, and the electric potential of the high concentration n-type polysilicon thin film 401 under the high resistance region 104 are nearly equal.

The electric potential relationship between the polysilicon resistors 106 and 107, the wirings 203 and 204 disposed on the upper portion of polysilicon resistors 106 and 107, respectively, and the high concentration n-type polysilicon thin films 402 and 403 disposed below the polysilicon resistors 106 and 107, respectively, is similar. The resistance values of each of the polysilicon resistors 105, 106, and 107 are thereby accurately maintained by making the electric potentials of each of the polysilicon resistors themselves and the wirings and the high concentration n-type polysilicon thin films disposed on and under the polysilicon resistors, equal.

Note that, although not shown in the figure, a process of manufacturing can be made simpler by forming a gate electrode from the same film as that used for the high concentration n-type polysilicon thin films 401, 402, and 403 for cases in which a MOS transistor is formed on the same chip as the breeder resistance circuit. Further, from the standpoint of reliability, it is also effective to use a composite film having a silicon nitride film for one or both of the first insulating film 404 and the second insulating film 405, as discussed by the example of FIG. 1. Further, there are no limitations placed on the number of the polysilicon resistors, and it may be set in accordance with the number of divided voltages required in the bleeder resistance circuit. In addition, the wirings are made from aluminum in FIG. 2, but the wirings may also be made form a laminate film of a barrier metal and a silicide film. In the present invention, a laminate film of TiN and Ti may be used as the barrier metal, and Al—Si—Cu may be used as the silicide film. Note that Al—Si may also be used as the silicide film.

Figure 3:
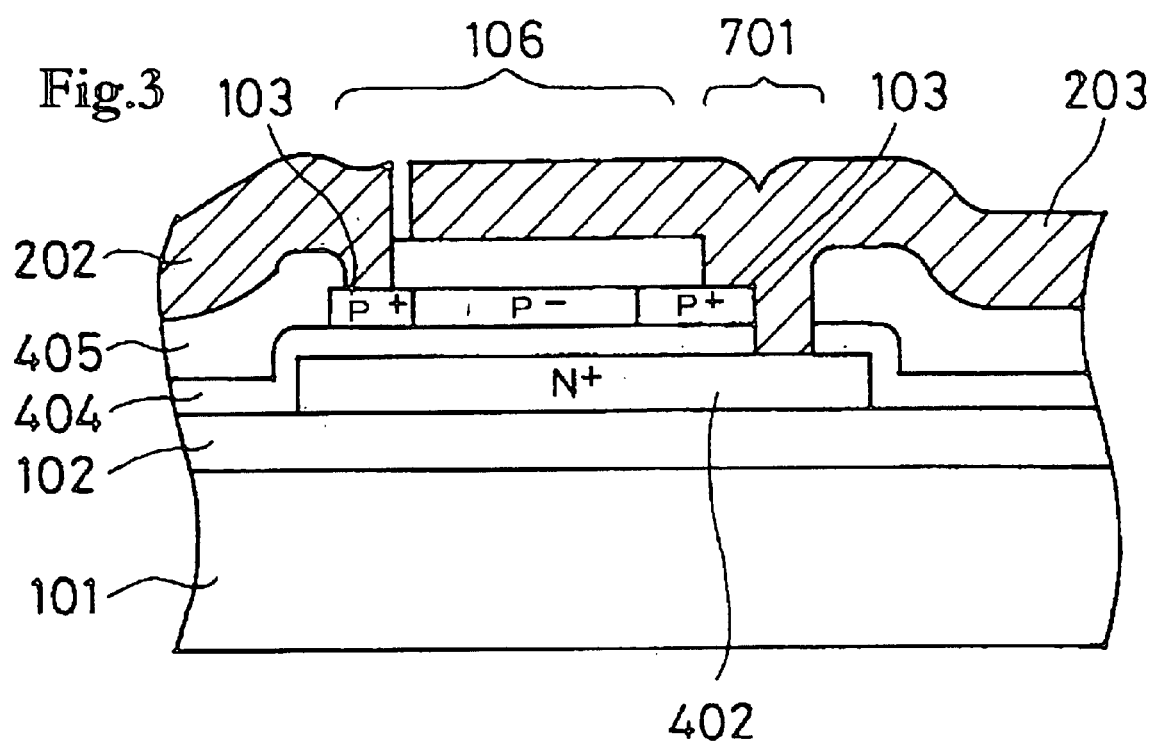
FIG. 3 is an enlarged schematic cross sectional diagram showing a portion of an embodiment of a bleeder resistance circuit region of a semiconductor device of the present invention.

FIG. 3 is an enlarged schematic cross sectional diagram showing a portion of a bleeder resistance circuit region of a semiconductor device of the present invention. Differing from the example shown in FIG. 2, connections between the aluminum wiring 203, and the high concentration p-type impurity region 103 and the high concentration n-type polysilicon thin film 402 of the polysilicon resistor 106, all of which are to have the same electric potential, are made through a single contact hole 701. An area occupied by a region for forming the contact hole can thus be made smaller, and this is effective in reducing the surface area of the entire bleeder resistance circuit region. Explanation of other portions is accomplished by attaching reference numerals which are identical to those of FIG. 2.

Figure 4:
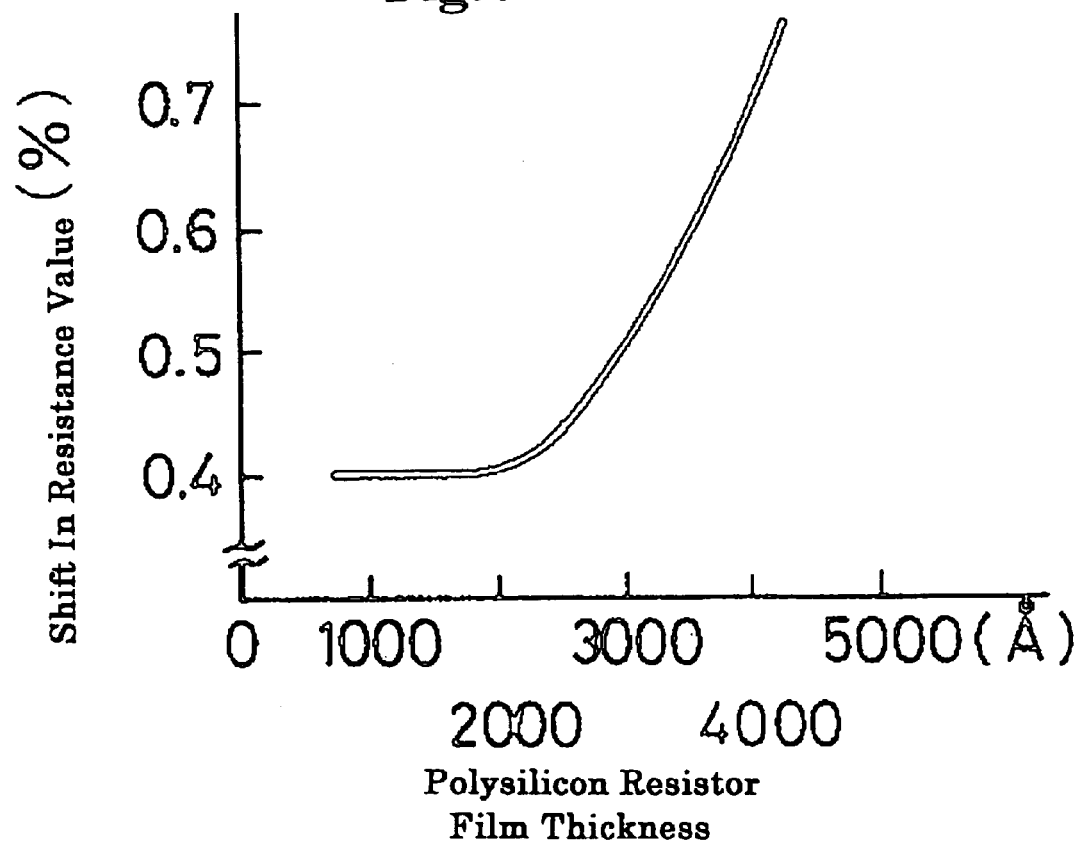
FIG. 4 is a diagram showing a relationship between shift in a resistance value of a polysilicon resistor and a film thickness of the polysilicon resistor for a case in which a 5-volt electric potential is applied to an aluminum wiring on an upper portion of the polysilicon resistor having a sheet resistance of 10 kilo-ohms.

FIG. 4 is a diagram showing the relationship between the shift (dispersion) in the resistance values of a polysilicon resistor and the film thickness of the polysilicon resistor for a case in which an electric potential of 0 to 5 volts is applied to an aluminum wiring on an upper portion of the polysilicon resistor having a sheet resistance of 10 kilo-ohms.

As is made clear from FIG. 4, the electric potential of the wirings is influenced less as the film thickness of the polysilicon resistors becomes thinner. In particular, dispersion in the resistance values can be made smaller by giving the polysilicon resistors a film thickness on the order of several tens of angstroms to 2000 Å. It is preferable to make the film thickness equal to, or greater than, 100 Å when employing a current manufacturing method (such as CVD) in order to form the polysilicon resistors by a uniform and continuous film. Dispersion in the resistance values rather arises if the film is non-continuous.

A high precision bleeder resistance circuit having little divided voltage output error, with an occupied small area can be achieved according to the semiconductor device of the present invention by using polysilicon thin film resistors into which a p-type impurity is introduced. Preferred embodiments of the present invention are explained below with reference to the figures.

Figure 5:
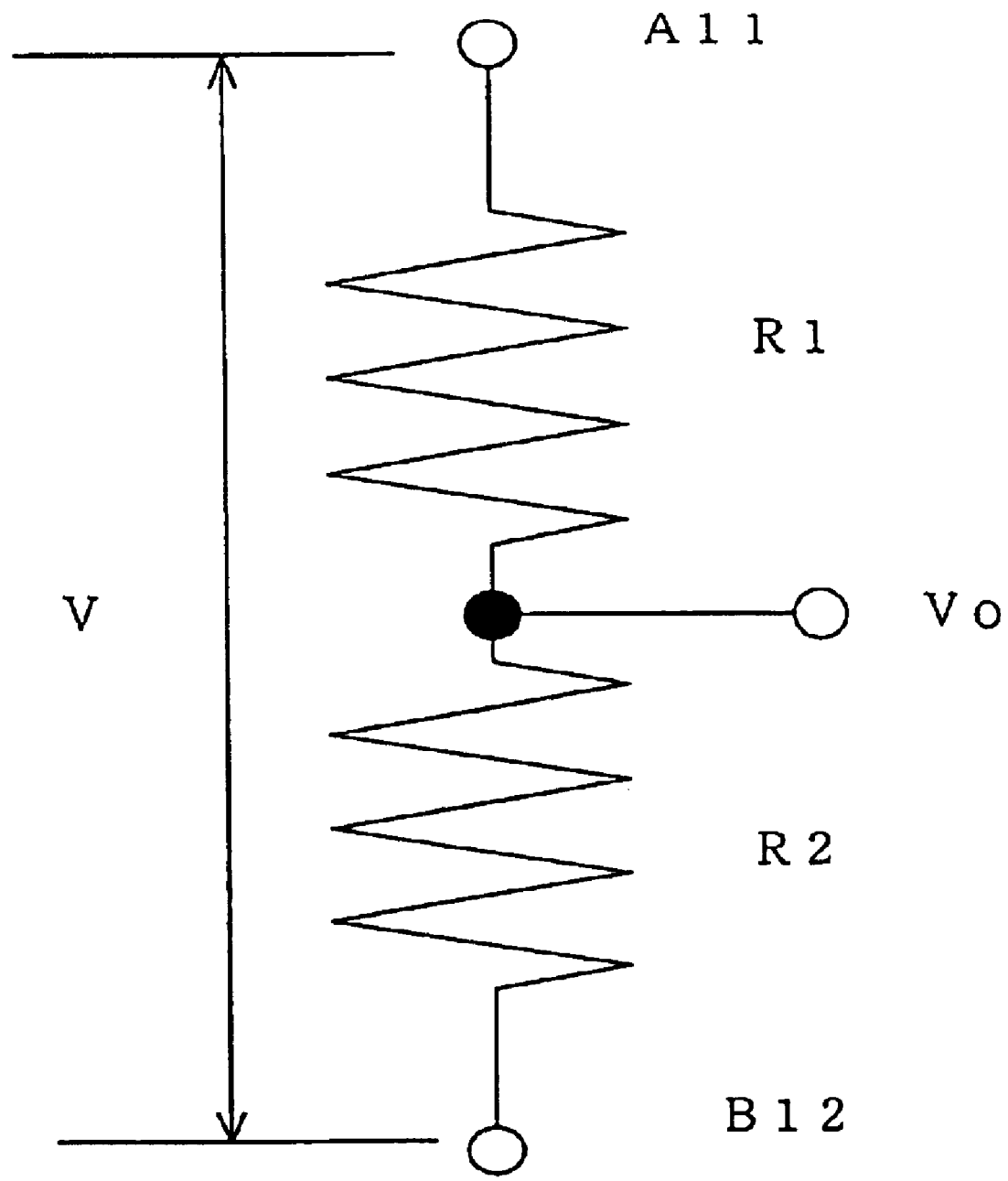
FIG. 5 is a circuit diagram of a breeder resistance circuit showing an embodiment of a semiconductor device of the present invention.

FIG. 5 is a circuit diagram of a bleeder resistance circuit showing an embodiment of a semiconductor device of the present invention. A divided voltage $V_0$ is obtained from a terminal C13 through resistors R1 and R2 when a voltage V is applied between a terminal A11 and a terminal B12. The divided voltage $V_0$ is expressed by the following equation:

$$V_0 = (R2/(R1+R2))*V \qquad \text{Equation 1}$$

The divided voltage $V_0$ of Equation 1 is taken as a theoretical value, and the difference between this theoretical value and actual measured values is taken as the divided voltage output error. The divided voltage output error is expressed by the following equation:

Voltage division output error=((|theoretical value $V_0$–actual measured value of $V_0$|)/theoretical value $V_0$ )*100          Equation 2

The fact that the divided voltage output error can be made smaller here by changing the impurity introduced to the polysilicon thin film resistors from an n-type impurity to a p-type impurity is explained here based upon data.

A small divided voltage output error, and a small integration surface area for a bleeder circuit can be given as characteristics required for polysilicon thin film resistors which structure a ladder circuit. Dispersion in the concentration of low concentration impurities is generally reduced if the thickness of a polysilicon film is made thinner, and therefore the divided voltage output error of the bleeder circuit becomes smaller, and a high precision bleeder circuit can be formed. However, if the length of the polysilicon thin film resistors into which an n-type impurity has been introduced (hereinafter referred to as n-type polysilicon thin film resistors) is shortened, then the divided voltage output error becomes large even if the polysilicon film thickness is made thin. Making the integration surface area small is thus difficult. However, the integrated surface area can be made small if the length of the resistors employing p-type polysilicon thin film resistors is made shorter. An example is explained using FIG. 6.

Figure 6:
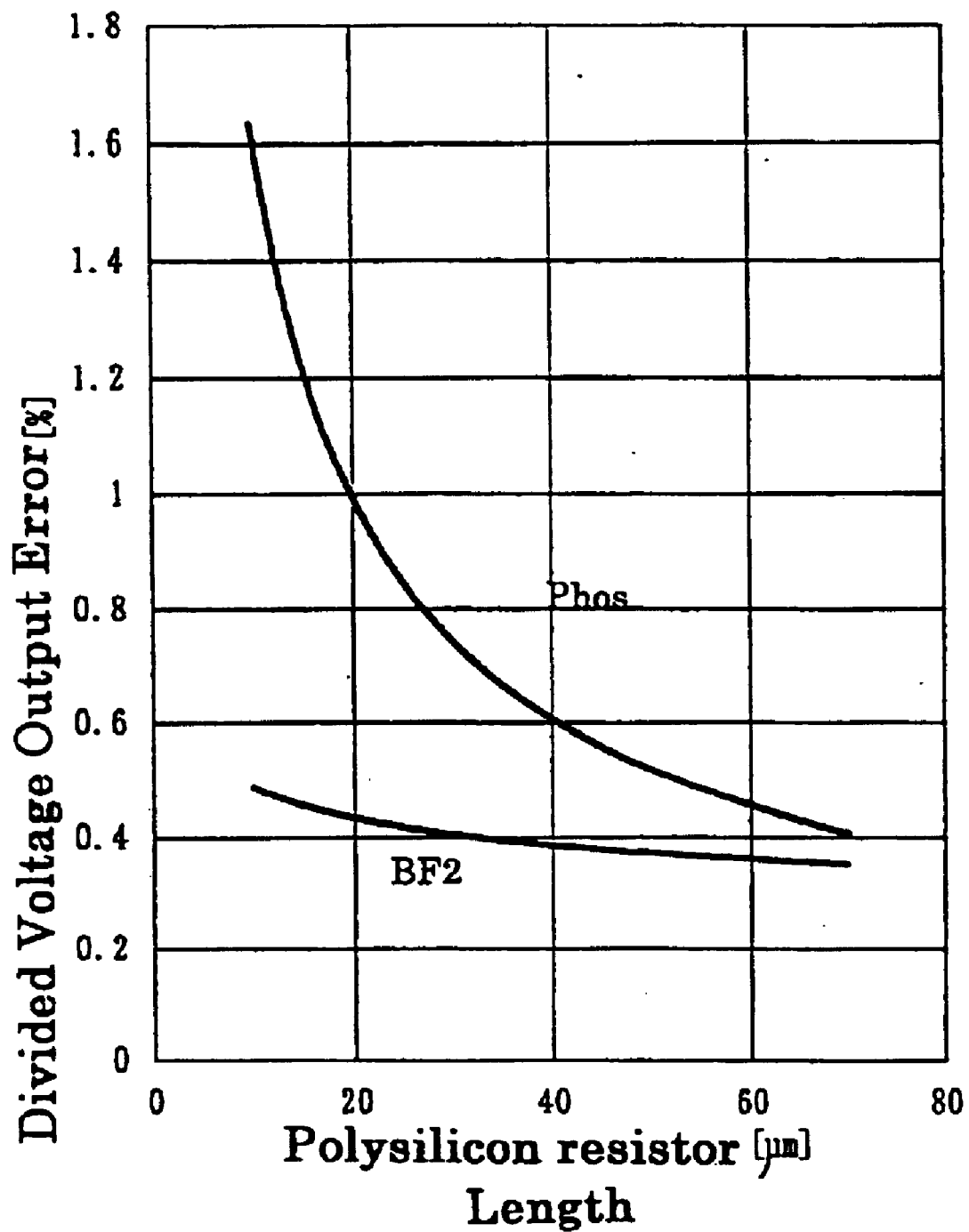
FIG. 6 is a diagram showing a relationship between a length of p-type and n-type polysilicon thin film resistors configuring a bleeder circuit having a film thickness of 1000 Å and a sheet resistance of 10 kΩ/square, and a divided voltage output error.

FIG. 6 is a diagram showing the relationship between the length of p-type and n-type polysilicon thin film resistors structuring a bleeder circuit having a film thickness of 1000 Å and a sheet resistance of 1 kΩ/square, and divided voltage output error. An example in which $BF_2$ ions are introduced into p-type polysilicon thin film resistors as a p-type impurity, and phosphorous is introduced into n-type polysilicon thin film resistors as an n-type impurity is shown.

From FIG. 6, it can be seen that the divided voltage output error cannot be kept equal to or less than 0.5% with assurance for a bleeder circuit structured by n-type polysilicon thin film resistors if the length of the polysilicon thin film resistors is made equal to or less than 30 μm, even if the thickness of the polysilicon film is made thinner to 1000 Å. However, the divided voltage output error can be made equal to or less than 0.5% with assurance for a breeder circuit structured by p-type polysilicon thin film resistors, even if the length of the polysilicon thin film resistors is 10 μm.

Figure 7:
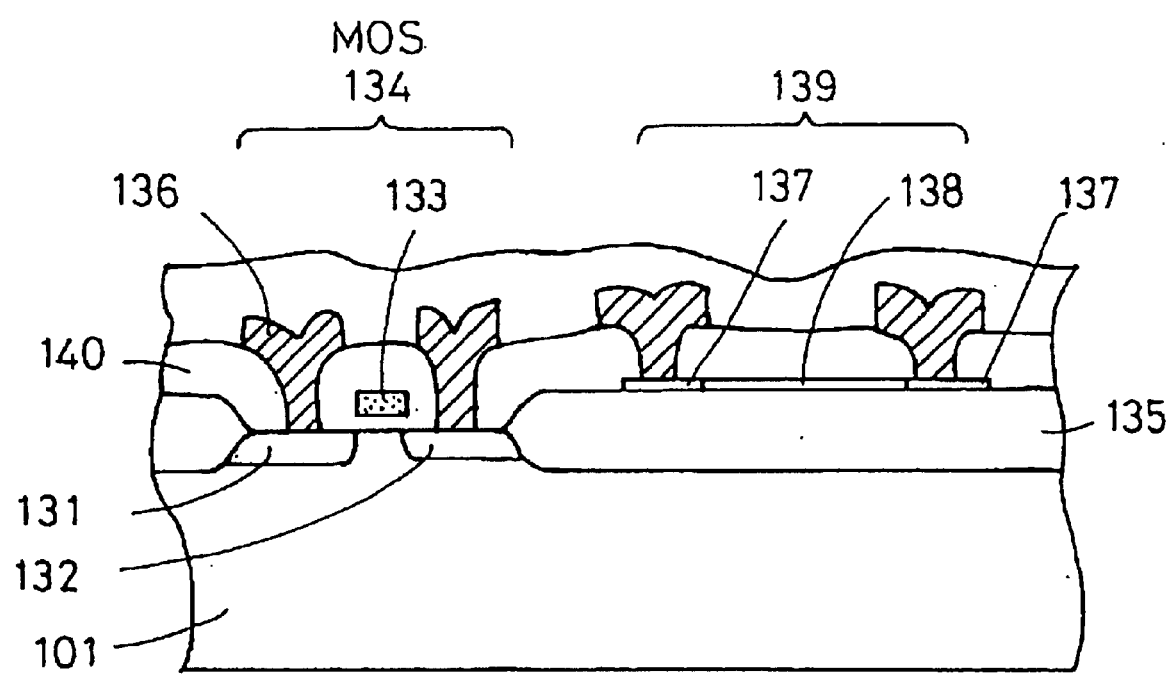
FIG. 7 is a schematic cross sectional diagram showing another embodiment of a semiconductor device of the present invention.

FIG. 7 is a schematic cross sectional diagram showing another embodiment of a semiconductor device of the present invention. The MOS transistor 134 is formed on the silicon semiconductor substrate 101 having a pair of the source region 131 and the drain region 132, and the polysilicon gate electrode 133. On the other hand, the polysilicon thin film resistor 139 having the high resistance region 138 sandwiched by the high concentration impurity regions 137 for achievement of contact to the aluminum wiring 136 is formed on the field oxide film 135. Although only one polysilicon thin film resistor is shown in FIG. 7 for simplicity, in practice the bleeder resistance circuit region is formed by a number of polysilicon thin film resistors.

In FIG. 7 the film thickness of the polysilicon gate electrode 133 of the MOS transistor 134 differs from the film thickness of the polysilicon thin film resistor 139 into which a p-type impurity is introduced, with the film thickness of the polysilicon thin film resistor 139 being formed thinner. The film thickness of the polysilicon gate electrode 133 may be set to 4000 angstroms, and the film thickness of the polysilicon thin film resistor 139 may be set to 1000 angstroms, for example. A portion of the polysilicon gate electrode 133 must serve as a wiring, and therefore it is preferable that it have as low a sheet resistance value as possible. In contrast, it is required for the polysilicon thin film resistor 139 to have the sheet resistance value as high and accurate as possible, and to have a temperature coefficient of a resistance value as small as possible. Changing the film thickness of the polysilicon gate electrode 133, and the thickness of the polysilicon thin film resistor 139 of the MOS transistor 134, in accordance with the purpose therefore becomes a natural and effective means. Making the film thickness thinner and introducing a p-type impurity are simple methods for reducing the temperature coefficient of the resistance value of the polysilicon thin film resistors 139, and have a large effect. An explanation is presented below based upon experimental data.

Figure 8:
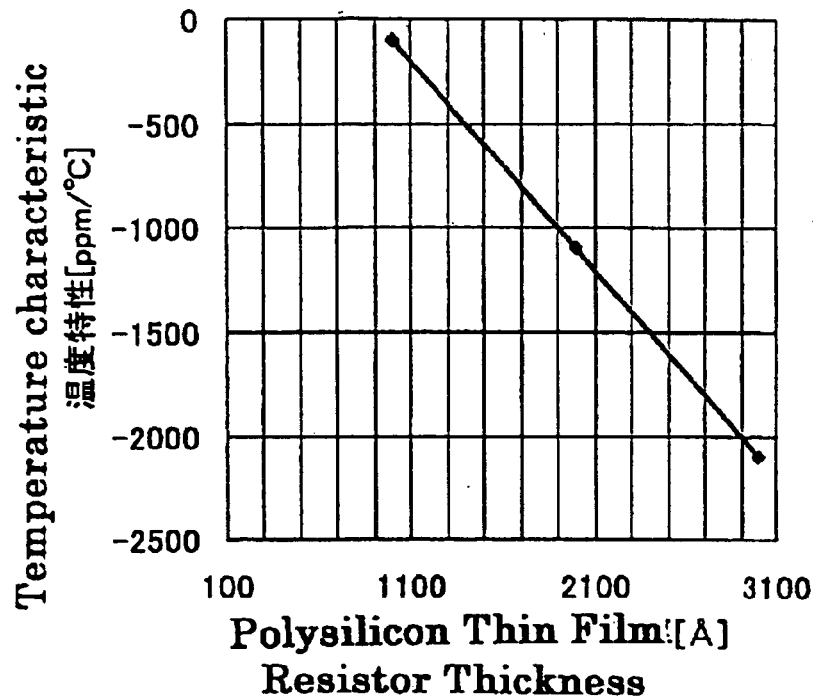
FIG. 8 is a diagram showing a relationship between a temperature coefficient (TC) of the resistance value of a polysilicon thin film resistor used in a bleeder resistance circuit and having a sheet resistance of 10 kilo-ohms, and a film thickness of the polysilicon thin film resistor.

FIG. 8 is a diagram showing the relationship between the temperature coefficient (TC) of the resistance value of a polysilicon thin film resistor used in a bleeder resistance circuit and having a sheet resistance of 1 kilo-ohm, and the film thickness of the polysilicon thin film resistor. It is known that the temperature coefficient (TC) of the resistance value of a polysilicon thin film resistor can be reduced greatly by making the film thickness of the polysilicon thin film resistor thinner. In particular, it is possible to reduce the TC to a value equal to or less than –100 ppm/° C. with a film thickness equal to or less than 1000 angstroms.

FIG. 8 shows an example relating to polysilicon thin film resistors having a sheet resistance of 10 kilo-ohms. However, experiments by the inventors of the present invention have shown that the temperature coefficient (TC) of the resistance value of polysilicon thin film resistors, having a sheet resistance within a range of at least 1 to 500 kilo-ohms, can be reduced by reducing the film thickness of the polysilicon thin film resistors.

Figure 9:
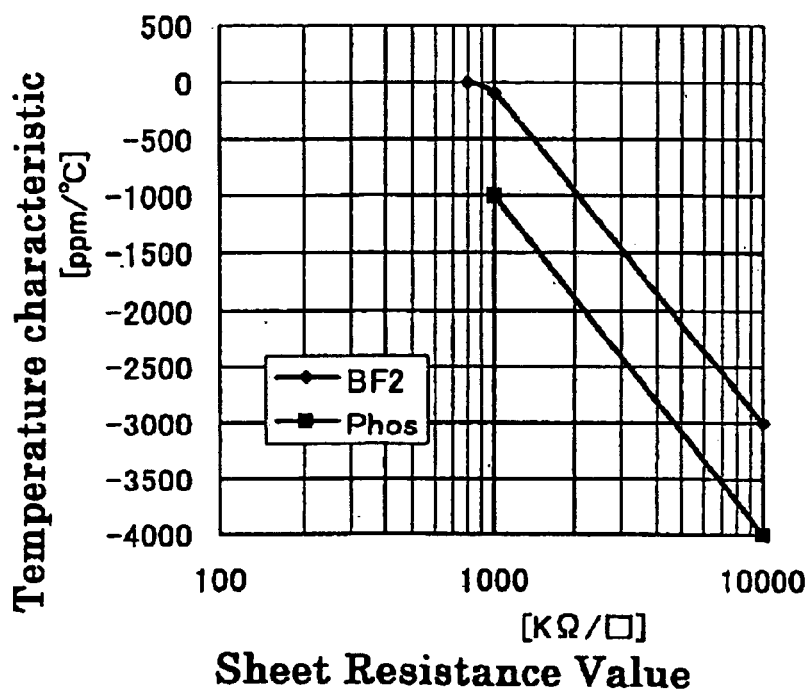
FIG. 9 is a diagram showing a relationship between the sheet resistance value and the temperature coefficient when using BF2 as a p-type impurity, and phosphorous as an n-type impurity, in a polysilicon film having a film thickness of 1000 Å.

FIG. 9. is a diagram showing the relationship between the sheet resistance value and the temperature coefficient (TC) when using $BF_2$ as a p-type impurity, and phosphorous as an n-type impurity, in a polysilicon film having a film thickness of 1000 Å. FIG. 9 shows that fluctuation in the resistance value with respect to the temperature of the p-type polysilicon thin film resistor is small compared to that seen in the n-type polysilicon thin film resistor.

Dispersion in the concentration of the low concentration impurity becomes large if the sheet resistance value is made large, and the divided voltage output error becomes large. In addition, fluctuations in the resistance value with respect to temperature also becomes large, and therefore it is preferable that the sheet resistance value be equal to or less than 25 kΩ/square. Further, dispersion in grain size cannot be overlooked if the resistance value is small, and therefore it is preferable that the sheet resistance value be equal to or greater than 500 Ω/square. That is, it is preferable that the sheet resistance value of the p-type polysilicon thin film resistors be from 500/square to 25 k/square. Furthermore, in order that fluctuations in the resistance value with respect to the temperature of the p-type polysilicon thin film resistors may be equal to or less than –100 ppm/° C. at this point, it is preferable that the sheet resistance value of the polysilicon thin film resistors be from 500 Ω/square to 1 kΩ/square.

Figure 10:
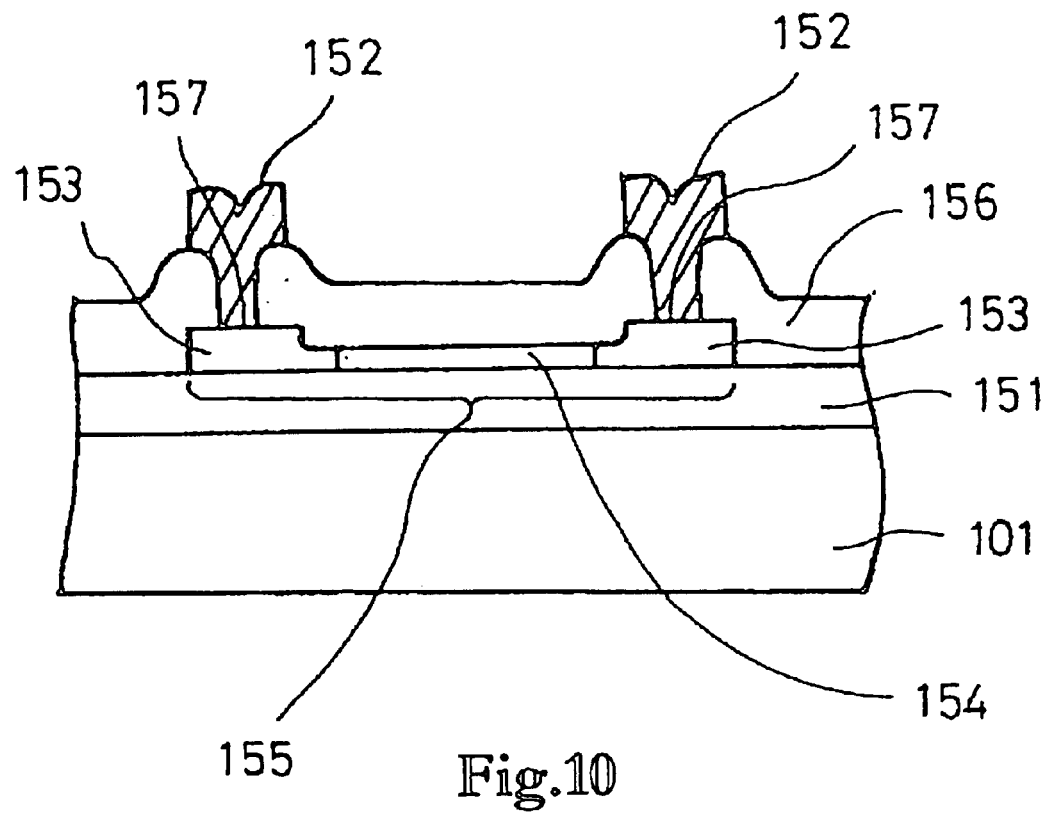
FIG. 10 is a schematic cross sectional diagram showing another embodiment of a semiconductor device of the present invention.

FIG. 10 is a schematic cross sectional diagram showing another embodiment of a semiconductor device of the present invention. A first insulating film 151 made from a silicon dioxide or the like is formed on the silicon semiconductor substrate 110. A polysilicon thin film resistor 155 is formed having a resistance region 154 sandwiched by regions 153 for contacting a metallic wiring 152 made form aluminum or the like, on a level surface of the first insulating film 151. A second insulating film 156 made from PSG, BPSG or the like is formed on a polysilicon thin film resistor 155, into which a p-type impurity is introduced, and on the first insulating film 151. A contact hole 157 is formed in the second insulating film 156, and the metallic wiring 152 and the contact forming region 153 are electrically connected.

The film thickness of the resistance region 154 in the polysilicon thin film resistor 155 is made smaller than that of the contact forming region 153. An accurate sheet resistance value is obtained by making the film thickness of the resistance region 154 thin, and a small temperature coefficient is ensured while reducing the occupied surface area. On the other hand, the contact forming region 153 is formed with a large thickness so that penetration of the polysilicon film during formation of the contact hole 157 in order to achieve connection to the metallic wiring 152 does not take place. According to experiments by the inventors of the present invention, it is understood that the temperature coefficient of the resistance value can be made extremely small at a value equal to or less than $-100$ ppm/° C. by making the film thickness of the resistance region 154 equal to or less than 1000 angstroms when the sheet resistance value is approximately 1 kilo-ohm/square. Further, contact holes are generally formed by using dry etching with current IC processing in order to achieve miniaturization thereof.

Over-etching is performed when forming the contact hole 157 in the second insulating film 156, so that there unetched portion does not remain, but the contact forming region 153 within the polysilicon thin film resistor 155 is also etched during that period. Penetration of the contact hole 157 is prevented by making the film thickness of the contact forming region 153 thicker. Penetration can be prevented provided that the film thickness of the contact forming region 153 is set so as to be roughly equal to or greater than 2000 angstroms for cases in which the second insulating film 156 is formed by PSG or BPSG having a film thickness equal to or less than 1 micron.

Figure 11:
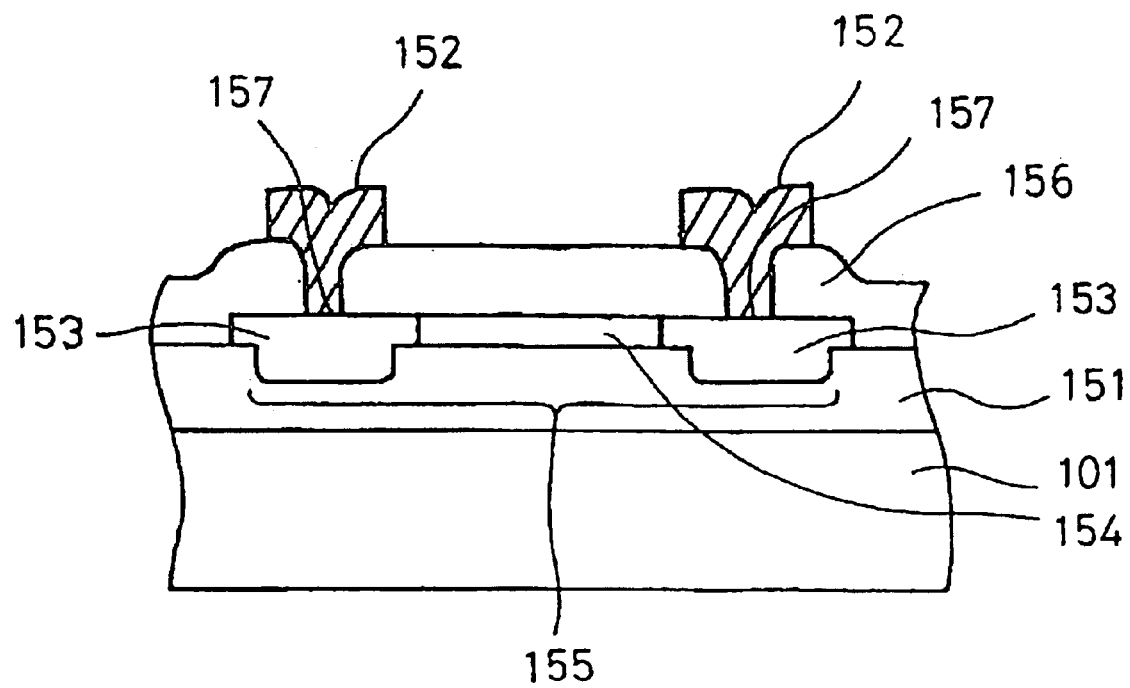
FIG. 11 is a schematic cross sectional diagram showing another embodiment of a semiconductor device of the present invention.

FIG. 11 is a schematic cross sectional diagram showing another embodiment of a semiconductor device of the present invention. The following points differ from the example of FIG. 10: the film thickness of the first insulating film 151 is partially different; the contact forming region 153 of the polysilicon thin film resistor 155 is formed on a region having a thin film thickness; the resistance region 154 is formed on a region having a thick film thickness; and upper surfaces of the contact forming region 153 and the resistance region 154 are formed into a nearly level and identical plane. The film thickness of the resistance region 154 can be made thin, whereas the contact forming region 153 can be made thicker, and therefore the effect explained by the example of FIG. 10 can thus be obtained. Explanation for other portions is accomplished by attaching the same reference numerals as those of FIG. 10.

Only one polysilicon thin film resistor is shown in FIG. 10 and FIG. 11 for simplicity, but an actual resistor circuit region will be formed by many polysilicon thin film resistors. Furthermore, although the wiring is made from aluminum in FIG. 10 and FIG. 11, the wiring may also be a laminate film of barrier metal and a silicide film. For example, in the present invention, TiN and Ti are used as barrier metals and Al—Si—Cu is used as a silicide film. However, the silicide film may also be Al—Si.

Figure 12:
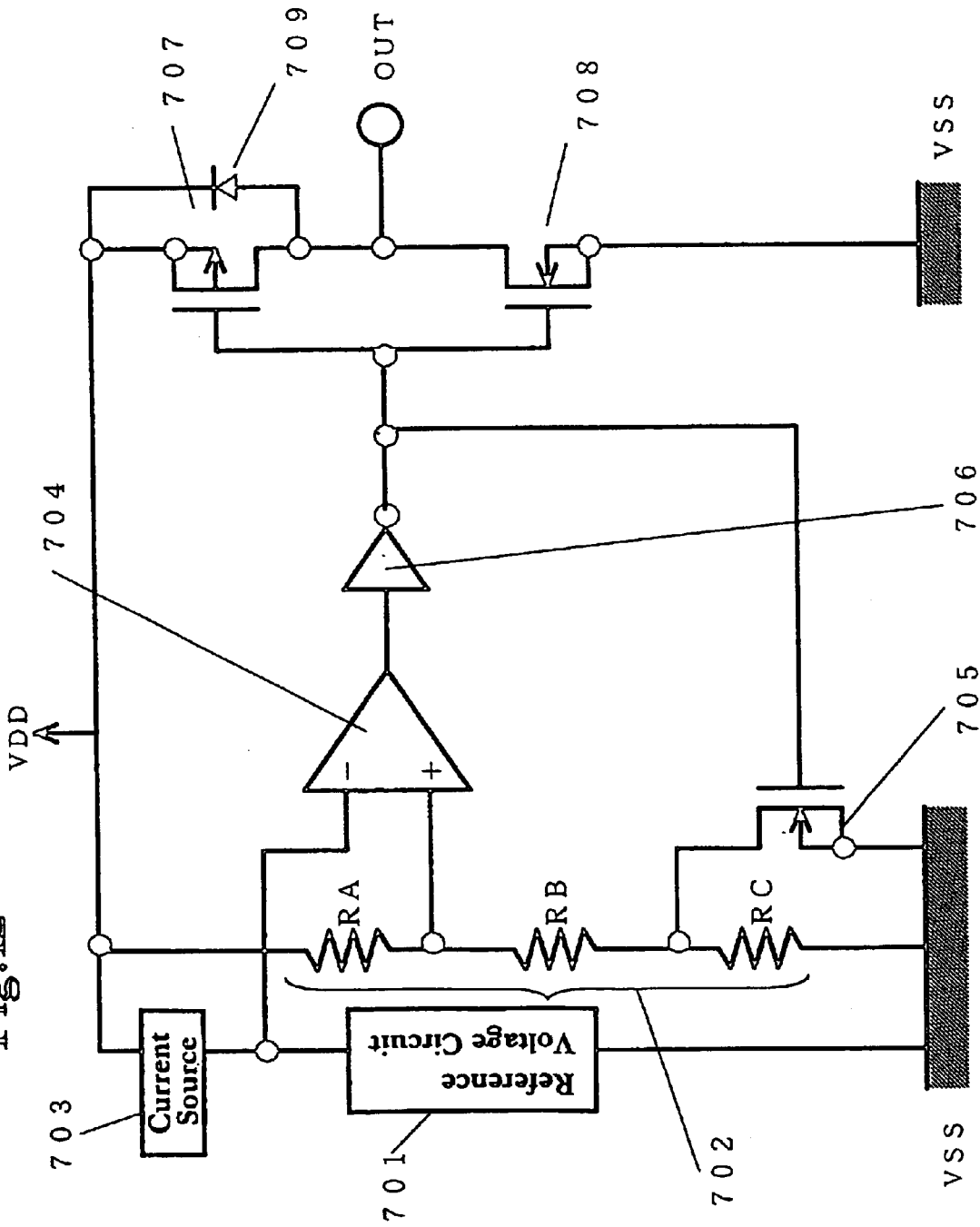
FIG. 12 is a block diagram of an embodiment of a voltage detector using a bleeder resistance circuit in accordance with the present invention.

FIG. 12 is a block diagram of an embodiment of a voltage detector using a bleeder resistance circuit of the present invention. An example of a simple circuit is shown in the figure for simplicity, but functions may be added as required for an actual manufactured product.

The basic circuit structural elements of the voltage detector are an electric current source 703, a reference voltage circuit 701, a bleeder resistance circuit 702, and an error amplifier 704. In addition, an inverter 706, n-type transistors 705 and 708, a p-type transistor 707, and the like are also added. Operation is explained simply and in part below.

The n-type, transistors 705 and 708 turn off when VDD is equal to or greater than a predetermined cancellation voltage, and the p-type transistor 707 turns on. VDD is output to an output OUT. An input voltage to the error amplifier 704 becomes (RB+RC)/(RA+RB+RC)*VDD at this point.

VSS is output to the output OUT if VDD drops and becomes equal to or less than a detection voltage. The n-type transistor 705 is on at this point, and the input voltage to the error amplifier 704 becomes RB/(RA+RB)*VDD.

Basic operation is thus performed by comparing a reference voltage generated by the reference voltage circuit 701, and the voltage divided by the bleeder resistance circuit 702, by using the error amplifier 704. The precision of the voltage divided by the bleeder resistance circuit 702 therefore becomes extremely important. If the precision of the divided voltage from the bleeder resistance circuit 702 is poor, then the voltage input to the error amplifier 704 will have dispersion, and a predetermined cancellation voltage or detection voltage cannot be obtained.

A high precision voltage division becomes possible in accordance with the breeder resistance circuit of the present invention, and therefore yield of the manufactured product for ICs can be increased, and it becomes possible to manufacture a higher precision divided detector. Further, in order to suppress the electric current consumption of the IC, the resistance value of the entire bleeder resistance circuit 702 is maintained at a fixed precision. Resistors having an extremely long and thin shape are therefore combined for the bleeder resistance circuit, and a large surface area is required. It is not unusual for a breeder resistance circuit to occupy over one-half of the entire surface area of an IC chip. Dispersion in the resistance value of each resistor in the bleeder resistance circuit of the present invention is small, however, and a fixed precision can be obtained by using a shorter shape. The surface area occupied by the bleeder resistance circuit can therefore be made smaller, and this has a large contribution to reduction in the surface area of the entire IC chip.

Figure 13:
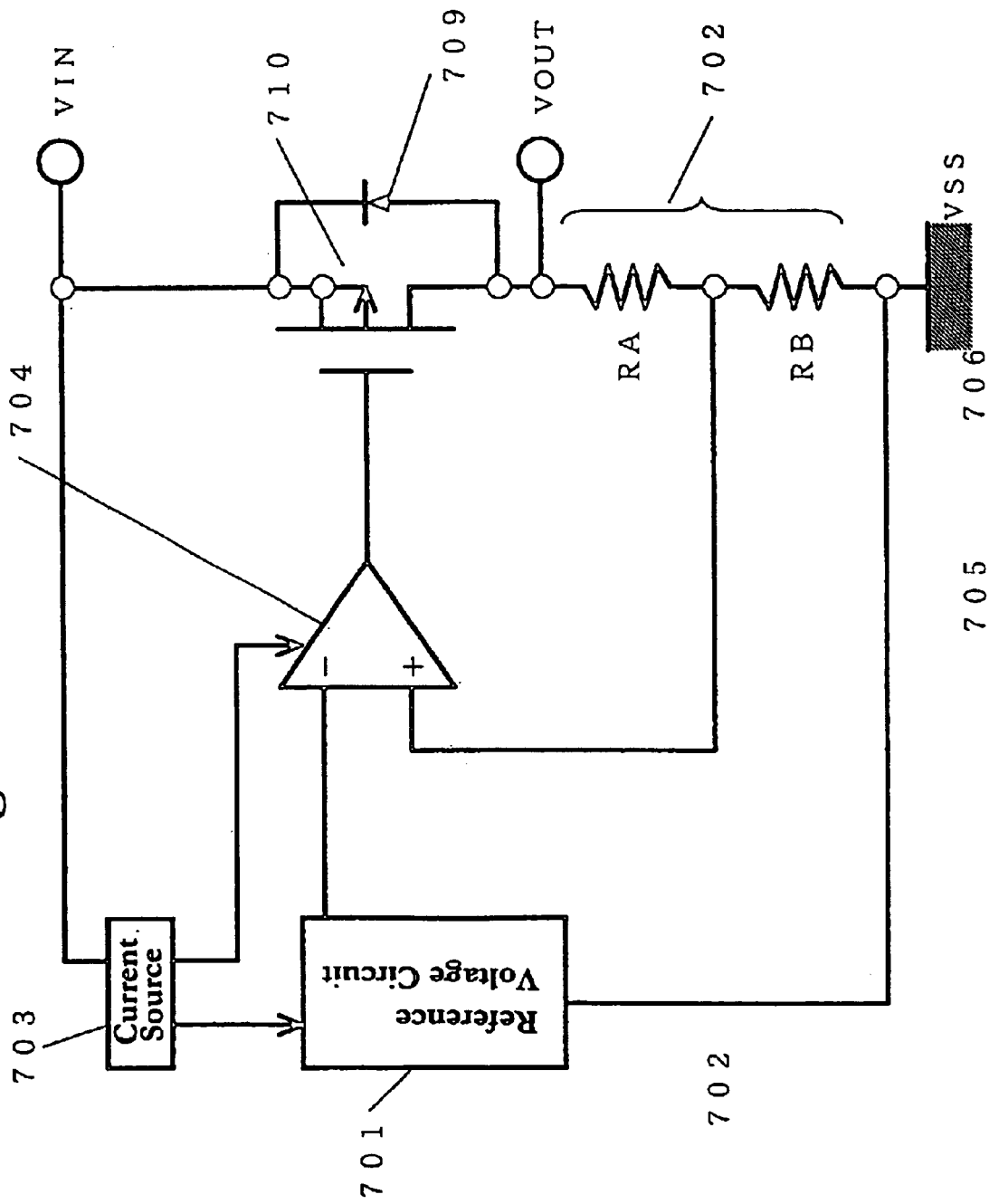
FIG. 13 is a block diagram of an embodiment of a voltage regulator using a bleeder resistance circuit in accordance with the present invention.

FIG. 13 is a block diagram of an embodiment of a voltage regulator using a bleeder resistance circuit of the present invention. A simple circuit is shown by way of example in the figure for simplicity, but functions may be added to actual manufactured products as necessary.

Basic circuit structural elements of the voltage regulator are the electric current source 703, the reference voltage circuit 701, the bleeder resistance circuit 702, and the error amplifier 704. A p-type transistor 710 serving as an electric current control transistor, and the like a real so provided therein. Simple operation is explained in part below.

The error amplifier 704 compares the voltage divided by the bleeder resistance circuit 702 and the reference voltage generated by the reference voltage circuit 701, and supplies to the p-type transistor 710 a gate voltage necessary for obtaining a fixed output voltage VOUT that is not influenced by an input voltage VIN or temperature changes. Basic operation is also performed in the voltage regulator by comparing the reference voltage generated by the reference voltage circuit 701, and the voltage divided by the bleeder resistance circuit 702, by using the error amplifier 704, similar to the voltage detector explained in FIG. 12. The precision of the voltage divided by the breeder resistance circuit 702 therefore becomes extremely important. The voltage input to the error amplifier 704 will be dispersed if the precision of the voltage divided by the bleeder resistance circuit 702 is poor, and the predetermined output voltage VOUT will become impossible to obtain. A high precision voltage division becomes possible by using the bleeder resistance circuit of the present invention, and therefore yield of the manufactured product for ICs can be increased, and it becomes possible to manufacture a higher precision voltage regulator.

A method of manufacturing a semiconductor device in accordance with the present invention is explained next using FIGS. 14A to 14F and FIGS. 15A to 15F. FIGS. 14A to 14F are schematic cross sectional diagrams showing an embodiment of a method of manufacturing a semiconductor device in accordance with the present invention.

Figure 14:
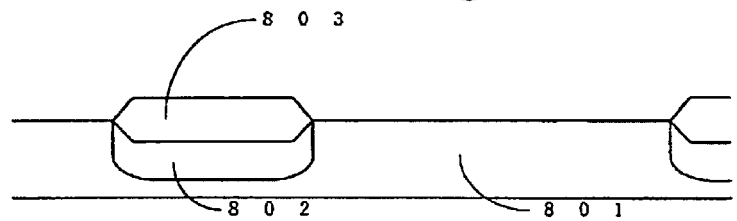
FIGS. 14A to 14F are schematic cross sectional diagrams showing an embodiment of a method of manufacturing a semiconductor device in accordance with the present invention.
Figure 14:
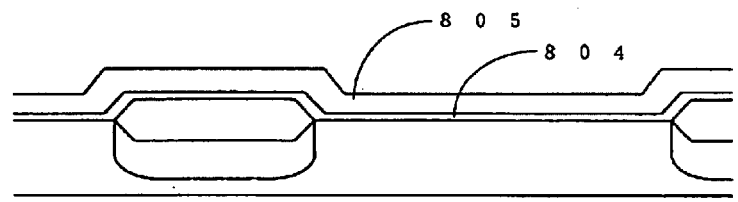
Figure 14:
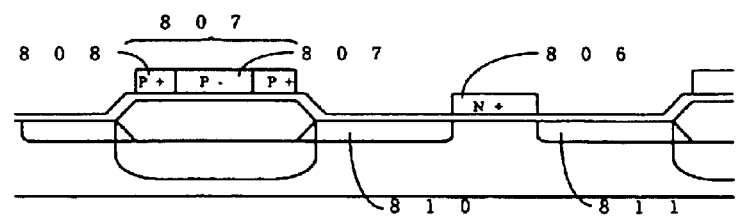
Figure 14:
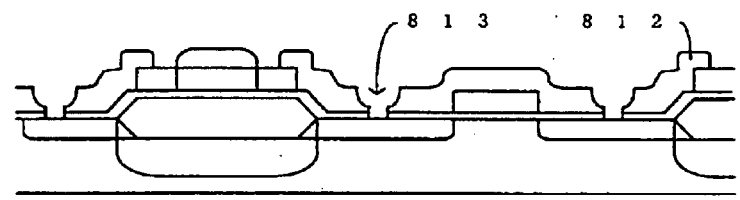
Figure 14:
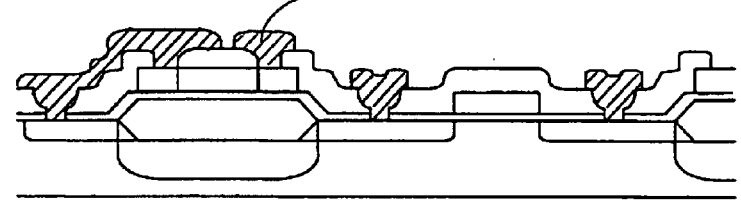
Figure 14:
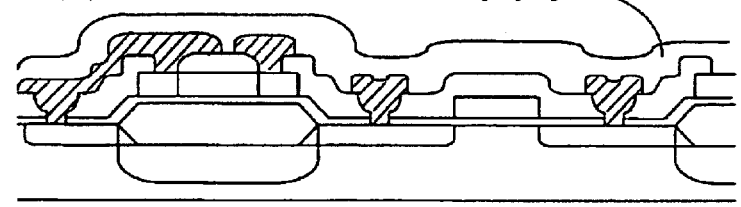

A thin, n-type silicon substrate 801 is prepared in FIG. 14A, and a p-type impurity is selectively introduced by ion implantation, followed by heat treatment, thus forming a separate and independent p-well region 802. The surface concentration of the p-well region 802 is approximately $1 \times 10^{16}$ atoms/cm$^3$. A field oxide film 803 having a thickness of approximately 8000 Å is then formed selectively by LOCOS.

A gate oxide film 804 is formed next as shown in FIG. 14B, after which channel doping is performed for controlling a predetermined threshold value. A polysilicon layer 805 is deposited by CVD at a thickness of approximately 4000 Å, and an impurity such as phosphorous is introduced by ion implantation in order to obtain a predetermined sheet resistance value.

An impurity such as BF$_2$ is selectively introduced next by ion implantation so that a predetermined region has the predetermined sheet resistance value, as shown in FIG. 14C. An impurity such as phosphorous is introduced selectively in a high concentration so that a predetermined region of the polysilicon layer 805 becomes low resistance, and then etching into a predetermined shape is performed, thus forming a polysilicon resistor 807 having a low resistance gate electrode 806 and a high resistance region 809. The polysilicon resistors 807 are disposed so as to align with the p-well region 802 formed by the previous step. A p-type impurity such as BF2 is then introduced by ion implantation, thus forming a source region 810 and a drain region 811 of a p-type transistor, and low resistance regions 808 of the polysilicon resistor. Although an n-type transistor is not shown in the figures here, an n-type impurity such as phosphorous may be added by ion implantation, thus forming a source region and a drain region of a transistor, similar to the p-type transistor.

Approximately 8000 Å of an intermediate insulating film 812 made of PSG, NSG, or the like is then deposited, and a contact hole 813 is then formed as shown in FIG. 14D. An aluminum layer 814 that becomes a wiring and has a thickness of approximately 1 micron is deposited next by sputtering as shown in FIG. 14E, and is patterned into a predetermined shape. The aluminum layer 814 is disposed on each of the polysilicon resistors 807 so that it is connected to the low resistance region 808 disposed on one edge of each of the polysilicon resistors 807. Further, although not shown in the figures, the aluminum layer 814 is also connected to the p-wells 802 disposed in portions under each of the polysilicon resistors 807, through the field oxide film 803.

A protective film 815 having a thickness of approximately 8000 Å is formed next as shown in FIG. 14F from a silicon nitride film. The protective film 815 on regions for bonding pads etc. is then removed, although this is not shown in the figures. The semiconductor device having the polysilicon resistor of the present invention is thus completed by the aforementioned process steps.

FIGS. 15A to 15F are schematic cross sectional diagrams showing another embodiment of a method of manufacturing a semiconductor device in accordance with the present invention.

Figure 15:
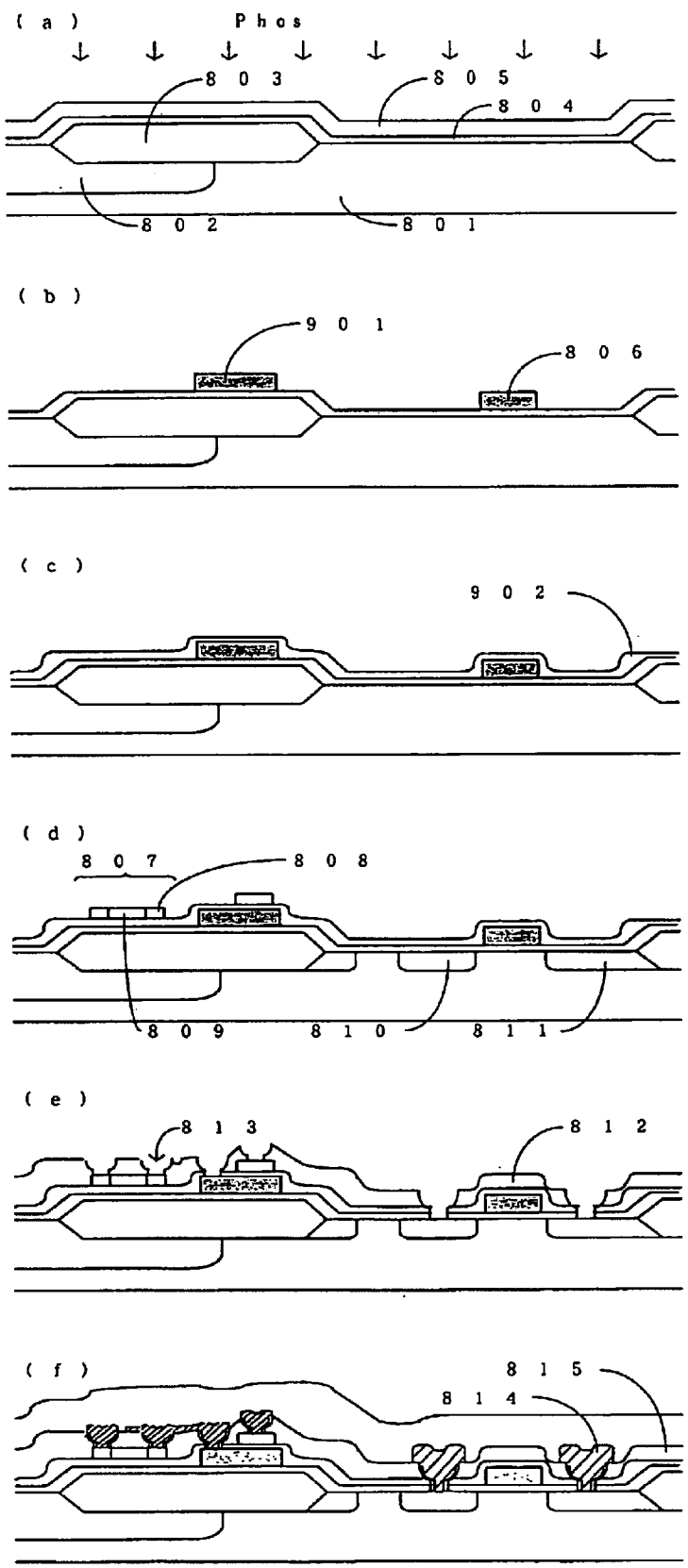
FIGS. 15A to 15F are schematic cross sectional diagrams showing another embodiment of the method of manufacturing a semiconductor device in accordance with the present invention.
Figure 16:
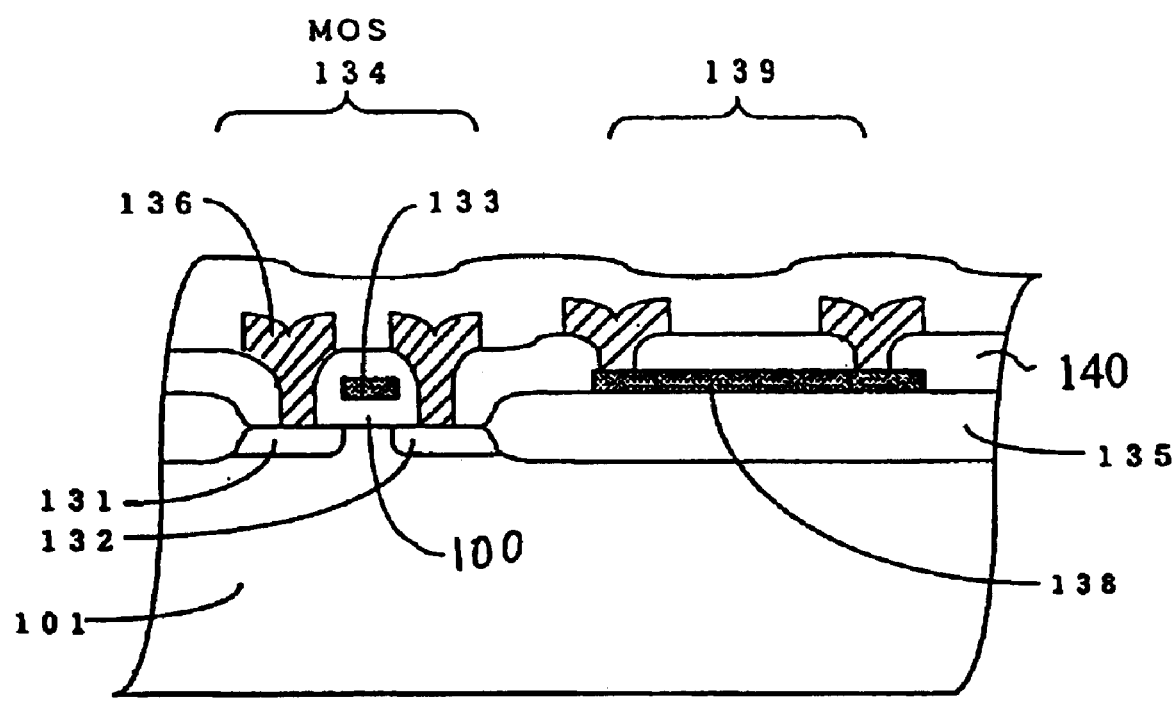
FIG. 16 is a schematic cross sectional diagram showing a semiconductor device of prior art.

The thin, n-type silicon substrate 801 is prepared in FIG. 15A, and a p-type impurity is selectively introduced by ion implantation. Heat treatment is then performed, thus forming the separate and independent p-well region 802. The surface concentration of the p-well region 802 is approximately $1 \times 10^{16}$ atoms/cm$^3$. Differing form the example explained by FIGS. 14A to 14F, it is not always necessary to form the p-well region 802 in a region where the polysilicon resistor is later formed. The field oxide film 803 is selectively formed next having a thickness of approximately 8000 Å by LOCOS. The gate oxide film 804 is then formed, after which channel doping used for controlling a predetermined threshold value is performed. The polysilicon layer 805 is then deposited at a thickness of approximately 4000 Å by CVD. An impurity such as phosphorous is then introduced in a high concentration so that the polysilicon layer 805 becomes low resistance.

Etching of the polysilicon layer 805 into a predetermined shape is then performed as shown in FIG. 15B, thus forming the low resistance gate electrode 806 and a low resistance polysilicon layer 901.

A first insulating film 902 is formed next as shown in FIG. 15C by thermal oxidation, CVD, or the like. The first insulating film 902 is made from a multi-layer film containing a silicon oxide film or a silicon nitride film.

Polysilicon is deposited next at a thickness of 1000 Å as shown in FIG. 15D, and an impurity such as BF$_2$ is introduced by ion implantation so that the sheet resistance value becomes a predetermined value. Patterning into a predetermined shape is then performed, after which a p-type impurity such as BF$_2$ is introduced by ion implantation, thus forming the contact forming regions 808, and the source region 810 and the drain region 811 of the p-type transistor simultaneously. The polysilicon resistor 807 having the resistance region 809 sandwiched by the contact forming regions 808 is thus complete. The respective polysilicon resistors 807 are formed on the independent low resistance polysilicon layer 901 through the first insulating film 902. Also, although an n-type transistor region is not shown in the figures, an n-type impurity such as phosphorous is introduced by ion implantation, thus forming a source region and a drain region of a transistor, similar to the p-type transistor.

Approximately 8000 Å of an intermediate insulating film 812 made of PSG, NSG, or the like is then deposited, and a contact hole 813 is then formed as shown in FIG. 15E. At this time, the low resistance region 808 of the polysilicon resistors 807 and the low resistance polysilicon layer 901 are connected through a common contact hole 903.

As shown in FIG. 15F, A Ti/TiN laminate film that becomes barrier metal is then deposited by sputtering to a thickness of approximately 1500 Å, and the aluminum layer 814 that later becomes a wiring is deposited to a thickness of approximately 1 micron and patterned into a predetermined shape. The aluminum layer 814 is arranged on each of the polysilicon resistors 807 at this point so that the low resistance region 808 disposed on one edge of each of the polysilicon resistors 807, and the low resistance polysilicon layer 901 disposed in a portion under each of the polysilicon resistors 807, through the first insulating film 902, are connected through a common contact hole 903. The protective film 815 is formed next from a silicon nitride film having a thickness of approximately 8000 Å. Although not shown in the figures, the protective film 815 on regions for bonding pad regions etc. is removed. The semiconductor device having the polysilicon resistor of the present invention is thus completed in accordance with the aforementioned process steps.

As discussed above, the resistance value of each polysilicon resistor in a bleeder resistance circuit is correctly maintained in accordance with the present invention by making the electric potential of each polysilicon resistor itself equal to the electric potential of conductors positioned above and below the polysilicon resistors. A high precision bleeder resistance circuit having an accurate divided voltage ratio can therefore be achieved. Dispersion in the resistance values of each of the polysilicon resistor is reduced by making the film thickness of the polysilicon resistors equal to, or less than, 2000 Å and making an impurity introduced to the polysilicon resistors a p-type impurity. Further, a high precision breeder resistance circuit can be achieved by setting the sheet resistance value to 700 Ω/square to 1000 Ω/square, thus setting the temperature characteristic to a value form 0 to 100 ppm/° C. In particular, an extremely small temperature coefficient equal to or less than about 0 ppm/° C. can be obtained at a sheet resistance value of approximately 800 Ω/square by making the film thickness equal to or less than 1000 Å. A bleeder resistance circuit capable of maintaining a high divided voltage precision over a wide temperature range can thus be formed occupying a smaller surface area than that of a bleeder resistance circuit formed by a conventional method.

High precision divided voltage becomes possible in a voltage detector and a voltage regulator of the present invention. It thus becomes possible to increase yield of the manufactured product as an IC, and to manufacture very high precision products. It is not unusual for a bleeder resistance circuit to occupy over one-half of the entire surface area of an IC chip in the case of the voltage detector. Dispersion in the resistance value of each resistor in the bleeder resistance circuit of the present invention is small with a small temperature characteristic, however, and a fixed precision can be obtained by using a shorter shape. The bleeder resistance circuit with high precision can be achieved and the surface area occupied by the bleeder resistance circuit can therefore be made smaller, and this has a large contribution to reduction in the surface area of the entire IC chip.

The above semiconductor device can be formed by using the method of manufacturing a semiconductor device of the present invention without the need for any special process steps and without the need for a considerable increase in the number of process steps.

What is claimed is:

1. A semiconductor device comprising: a bleeder resistance circuit having a plurality of conductors, an insulating film disposed on the conductors, and a plurality of thin film resistors each containing p-type impurities and overlying a respective one of the conductors with the insulating film disposed therebetween, each of the conductors having a thickness in the range of 10 to 2000 angstroms and being electrically connected to and having the same electric potential as a respective one of the thin film resistors.

2. A semiconductor device according to claim 1; wherein the conductors comprise first conductors and the insulating film comprises a first insulating film; and further comprising a second insulating film disposed on the thin film resistors and a plurality of second conductors each formed on and connected to a respective one of the thin film resistors with the second insulating film disposed therebetween.

3. A semiconductor device according to claim 1; wherein each of the thin film resistors is made from polysilicon.

4. A semiconductor device according to claim 2; wherein each of the thin film resistors is made from polysilicon.

5. A semiconductor device according to claim 1; wherein the p-type impurities comprise $BF_2$.

6. A semiconductor device according to claim 1; wherein the p-type impurities comprise boron.

7. A semiconductor device according to claim 3; wherein each of the thin film resistors has a thickness in the range of several tens to 1000 angstroms.

8. A semiconductor device according to 3; wherein a sheet resistance value of each of the thin film resistors is from 700 Ω/square to 1000 Ω/square.

9. A semiconductor device according to claim 3; wherein a temperature characteristic of each of the thin film resistors is in the range of from 0 ppm° C. to 100 ppm/° C.

10. A semiconductor device according to claim 3; wherein each of the first conductors comprises a well region formed in a silicon substrate.

11. A semiconductor device according to claim 3; wherein each of the first conductors is made from polysilicon.

12. A semiconductor device according to claim 4; wherein each of the second conductors is made from polysilicon.

13. A semiconductor device according to claim 4; wherein each of the second conductors is made from aluminum.

14. A semiconductor device according to claim 4; wherein each of the second conductors comprises a laminate of a barrier metal and a silicide film.

15. A semiconductor device according to claim 4; wherein the thin film resistors are formed over a semiconductor substrate; and further comprising a MOS transistor formed on the semiconductor substrate and having a gate electrode, each of the first conductors being formed of the same material as the gate electrode.

16. A semiconductor device according to claim 3; further comprising an intermediate insulating film disposed on the thin film resistors, a plurality of contact holes formed in the intermediate insulating film, and a plurality of metallic wirings each formed in a respective one of the contact holes and connected to a respective one of the thin film resistors.

17. A semiconductor device according to claim 3; wherein the thin film resistors are formed over a semiconductor substrate; and further comprising a MOS transistor formed on the semiconductor substrate and having a gate electrode, a thickness of the gate electrode being greater than a thickness of each of the thin film resistors.

18. A semiconductor device according to claim 17; wherein the film thickness of each of the thin film resistors is in the range of several tens to 1000 angstroms.

19. A semiconductor device according to claim 17; wherein the p-type impurities comprise $BF_2$.

20. A semiconductor device according to claim 17; wherein the p-type impurities comprise boron.

21. A semiconductor device according claim 17; wherein each of the thin film resistors has a sheet resistance value in the range of 700 Ω/square to 1000 Ω/square.

22. A semiconductor device according to claim 3; further comprising an intermediate insulating film disposed on the thin film resistors, a plurality of contact holes formed in the intermediate insulating film, and a plurality of metallic wirings each formed in a respective one of the contact holes; and wherein each of the thin film resistors comprises a contact forming region connected to a respective one of the metallic wirings and a resistance region having a smaller thickness than a thickness of the contact forming region.

23. A semiconductor device according to claim 22; wherein the thickness of the contact forming region of each of the thin film resistors is in the range of several tens to 1000 angstroms and the film thickness of the resistance region is in the range of 2000 angstroms to 10,000 angstroms.

24. A semiconductor device according to claim 22; wherein for each of the thin film resistors, the contact forming region and the resistance region are formed on the same flat surface.

25. A semiconductor device according to claim 22; wherein for each of the thin film resistors, upper surfaces of the contact forming region and the resistance region form the same flat surface.

26. A semiconductor device according to claim 3; wherein the insulating film comprises a first silicon oxide film; and further comprising a second silicon oxide film disposed on the thin film resistors.

27. A semiconductor device according to claim 3; wherein the insulating film comprises a first insulating film; and further comprising a second insulating film disposed on the thin film resistors, at least one of the first insulating film and the second insulating film comprising a multi-layer structure having a silicon nitride film.

28. A semiconductor device comprising: a plurality of conductors; an insulating film formed on the conductors; a plurality of thin film resistors each having two ends and overlying a respective one of the conductors with the insulating film disposed therebetween, each of the thin film resistors containing p-type impurities and having a thickness in the range of 10 to 2000 angstroms; first connecting means connected to the ends of the thin film resistors for connecting the thin film resistors together in series; and second connecting means for conductively connecting each of the conductors to one end of the respective one of the thin film resistors so that each of the conductors is at the same potential as the respective one of the thin film resistors.

29. A semiconductor device according to claim 28; wherein the conductors comprise first conductors and the insulating film comprises a first insulating film; and further comprising a second insulating film overlying the thin film resistors and a plurality of second conductors each formed on the second insulating film and overlying a respective one of the thin film resistors.

30. A method of manufacturing a semiconductor device, comprising the steps of:
preparing a silicon substrate;
selectively forming a plurality of separate and independent well regions in a surface of the silicon substrate by ion implantation;
selectively forming a field oxide film over the well regions by LOCOS;
forming a gate oxide film over the field oxide film and the surface of the silicon substrate;
performing channel doping to control a predetermined threshold value;
depositing a polysilicon layer over the gate oxide film by CVD;
selectively introducing $BF_2$ into the polysilicon layer by ion implantation so that a sheet resistance value of the polysilicon layer becomes a predetermined value;
selectively introducing phosphorous in a high concentration into the polysilicon layer so that a predetermined region of the polysilicon layer achieves a low resistance;
etching the polysilicon layer to form a plurality of polysilicon resistors each disposed in alignment with a respective one of the well regions;
introducing phosphorous by ion implantation to form a source region and a drain region of an n-type transistor;
introducing boron ion implantation to form a source region and a drain region of a p-type transistor and to form low resistance regions of the polysilicon resistors;
depositing over the polysilicon resistors an intermediate insulating film made from a material selected from the group consisting of PSG and NSG;
forming a plurality of contact holes in the intermediate insulating film;
depositing an aluminum layer into each of the contact holes by sputtering to form a plurality of wirings each connected to a respective one of the well regions and to the low resistance region of a respective one of the polysilicon resistors;
patterning each of the aluminum layers into a preselected shape so that each of the aluminum layers is disposed on a respective one of the polysilicon resistors;
forming a protective film over the intermediate insulating film, the wirings, the polysilicon resistors, and regions of the semiconductor substrate corresponding to bonding pads; and
removing the protective film from at least the regions corresponding to the bonding pads.

31. A method of manufacturing a semiconductor device, comprising the steps of:
preparing a silicon substrate;
selectively forming a well region in a surface of the silicon substrate by ion implantation;
selectively forming a field oxide film over the well region by LOCOS;
forming a gate oxide film over the field oxide film and the surface of the silicon substrate;
performing channel doping to control a predetermined threshold value;
depositing a first polysilicon layer over the gate oxide film by CVD;
introducing phosphorous in a high concentration into that the first polysilicon layer so that the polysilicon layer achieves a low resistance;
etching the first polysilicon layer into a predetermined shape to form a plurality of low resistance gate electrodes and a plurality of low resistance polysilicon layers;
forming a first insulating film over the low resistance gate electrodes and the low resistance polysilicon layers by thermal oxidation and CVD;
depositing a second polysilicon layer over the first insulating film so that a film thickness of the second polysilicon layer is smaller than a thickness of the first polysilicon layer;
patterning the second polysilicon layer to form a plurality of polysilicon resistors each disposed over a respective one of the low resistance polysilicon layers with the first insulating film disposed therebetween;
introducing phosphorous by ion implantation to form a source region and a drain region of an n-type transistor;
introducing $BF_2$ by ion implantation to form a source region and a drain region of a p-type transistor so that sheet resistance value of the polysilicon resistors become a predetermined value;

depositing an intermediate insulating film made from a material selected from the group consisting of PSG and NSG;

forming a plurality of contact holes in the intermediate insulating film;

depositing an aluminum layer by sputtering into each of the contact holes to form a plurality of wirings each connecting a low resistance region of each of the polysilicon resistors to a respective one of the low resistance polysilicon layer;

patterning the wirings so that each of the wirings is disposed over a respective one of the polysilicon resistors;

forming a protective film over the intermediate insulating film, the wirings, the polysilicon resistors, and regions of the semiconductor substrate corresponding to bonding pads; and removing the protective film from at least the regions corresponding to the bonding pads.

* * * * *